US011421834B1

(12) United States Patent
Yin

(10) Patent No.: US 11,421,834 B1
(45) Date of Patent: Aug. 23, 2022

(54) LED STRIP AND MANUFACTURING METHOD THEREOF AND LED COMPONENTS USED THEREIN

(71) Applicant: Huaping Yin, Dongguan (CN)

(72) Inventor: Huaping Yin, Dongguan (CN)

(73) Assignee: Dongguan WORLDSEMI Technology CO., LTD., Dongguan (CN)

( * ) Notice: Subject to any disclaimer, the term of this patent is extended or adjusted under 35 U.S.C. 154(b) by 0 days.

(21) Appl. No.: 17/359,674

(22) Filed: Jun. 28, 2021

(30) Foreign Application Priority Data

Feb. 2, 2021 (CN) .......................... 202110141083.6

(51) Int. Cl.
F21S 4/24 (2016.01)
F21V 23/06 (2006.01)
F21V 19/00 (2006.01)
F21Y 115/10 (2016.01)

(52) U.S. Cl.
CPC ............ F21S 4/24 (2016.01); F21V 19/0035 (2013.01); F21V 23/06 (2013.01); F21Y 2115/10 (2016.08)

(58) Field of Classification Search
CPC ........ F21S 4/24; F21V 19/0035; F21V 23/06; F21Y 2115/10
See application file for complete search history.

(56) References Cited

U.S. PATENT DOCUMENTS

| 10,948,141 | B1* | 3/2021 | Machlis | H05K 1/028 |
|---|---|---|---|---|
| 2001/0036082 | A1* | 11/2001 | Kanesaka | B63B 45/02 362/555 |
| 2002/0110000 | A1* | 8/2002 | Marcus | F21S 8/032 362/555 |
| 2004/0115984 | A1* | 6/2004 | Rudy | F21S 4/10 439/405 |
| 2005/0092517 | A1* | 5/2005 | Fan | F21S 4/24 174/117 FF |
| 2005/0207151 | A1* | 9/2005 | Aanegola | F21V 21/002 362/227 |
| 2008/0205059 | A1* | 8/2008 | Tsuji | F21S 4/10 362/249.01 |
| 2016/0302309 | A1* | 10/2016 | Griffoni | F21V 21/005 |
| 2020/0043632 | A1* | 2/2020 | Walker | H05B 45/00 |
| 2020/0404791 | A1* | 12/2020 | Lin | H01L 33/62 |

* cited by examiner

Primary Examiner — Bryon T Gyllstrom
Assistant Examiner — Christopher E Dunay

(57) ABSTRACT

An LED strip includes a plurality of LED components and a wire set, the LED component comprising: an insulated main body, conductive terminals fixed on the insulated main body and connected to the wire set, and lighting an LED chip and a control unit configured on the insulated main body. The insulated main body has recessed notches. The wire set at least includes a first wire running through the notch, and the first wire is formed with a cut portion. When producing the LED strip in series connection, the LED components and the corresponding continuous wire can be soldered together directly by the means of SMT technique. Then, using a cutter and the preset notch, the wire can be cut at the position of the notch. In this way, the operation of SMT soldering for the LED strip can be completed quickly.

3 Claims, 7 Drawing Sheets

LED STRIP AND MANUFACTURING METHOD THEREOF AND LED COMPONENTS USED THEREIN

BACKGROUND OF INVENTION

1. Field of the Invention

The present invention relates generally to the technical field of LED lights, and more particularly to an LED strip, manufacturing method thereof, and LED components used therein.

2. Description of Related Art

LED components usually refer to LED beads or LED light sources. An LED component normally includes a frame and an LED chip sealed in the frame. At present, as LED components adopting RGB light source requires a built-in control chip unit, they usually have more than two leads. The frame of such LED components usually includes an insulated main body, such as a plastic base or a ceramic base. The insulated main body is provided with a holding chamber. The insulated main body is integrally fixed with a plurality of conductive leads. One end of the lead is extended into the holding chamber, to form a contact terminal, the other end of the lead is extended to the outer surface of the insulated main body (normally the bottom surface) to form a soldering portion (also called soldering disc). During manufacturing, the LED chip and the control chip units are fixed inside the holding chamber, and are connected to each lead terminal through wires. Finally, transparent plastic material is filled into the holding chamber to complete the packaging operation and form the LED component.

When using the LED component product to produce an LED strip, a plurality of LED components is directly soldered on the wire set to form an LED strip. The wire set at least includes power wires and signal wires. Due to the special manufacturing technique of this kind of products, to facilitate manufacturing, the wires must be fully continuous from the starting point to the ending point, so as to connect a plurality of LED components. All the LED components are connected in parallel. However, to make color-changing LED strip lights, in order to change the light source colors of each LED component, they must be input with corresponding control signals. The control signals are transmitted in series. The control signals are transmitted through the signal wire from the first LED component to the second LED component, and after outputting from the second LED component, they are further transmitted to the third LED component. As mentioned above, during manufacturing, to facilitate production, the frames of all LED components are directly connected to the signal wire. Thus, all LED components are connected in parallel. Therefore, in order to realize signal transmission in series and to change the above-the parallel connection to series connection, the signal wire must be cut between the input end and output end of the LED component. If the cutting operation for the signal wires is carried out after production, it will be very difficult because the LED frame normally has a square or round design and its soldering portion is basically a plane surface. If the cutting operation for the signal wires is carried out before production to form signal wire segments, and the signal wire segments are soldered between the signal transmission conductive terminals of the LED components, the operations will be far more difficult. Also, due to the tension of the wire material itself, the end portion of the cut signal wire segments will not be maintain on a relatively even surface. As a result, during SMT soldering, solder skips or solder joint failure will easily happen, causing bad quality of the LED component products and high cost of production.

SUMMARY OF THE INVENTION

In order to solve the above technical problems, the present invention adopts the following technical solutions:

An LED strip, comprising: a plurality of LED components, and a wire set to connect the plurality of LED components to form a strip, the LED component comprising: an insulated main body, conductive terminals fixed on the insulated main body and connected to the wire set, and lighting an LED chip and a control unit configured on the insulated main body, characterized in that: the insulated main body is provided with recessed notches, the wire set at least includes a first wire running through the notch, and the first wire is formed with a cut portion at the position of the notch, wires not running through the notch will not be cut.

More particularly, wherein the conductive terminals include: first conductive terminal and second conductive terminal located on the two sides of the notch, the first wire runs through the notch along the straight line on which the first conductive terminal and the second conductive terminal fall, and is electrically connected to the first conductive terminal and the second conductive terminal.

More particularly, wherein the conductive terminals at least includes: first conductive terminal, second conductive terminal, third conductive terminal, and fourth conductive terminal; the wire set at least includes: first wire and second wire, the second wire is sequentially connected to the third conductive terminals and fourth conductive terminals of all LED components, and the straight line on which the first conductive terminal and the second conductive terminal fall is parallel to the straight line on which the third conductive terminal and the fourth conductive terminal fall.

More particularly, wherein the conductive terminals include: first conductive terminal, second conductive terminal, third conductive terminal, fourth conductive terminal, fifth conductive terminal, and sixth conductive terminal; the wire set includes: first wire, second wire and third wire, the second wire is sequentially connected to the third conductive terminals and fourth conductive terminals of all LED components, the third wire is sequentially connected to the fifth conductive terminals and the sixth conductive terminals of all the LED components; and the straight line on which the first conductive terminal and second conductive terminal fall is parallel to the straight line on which the third conductive terminal and the fourth conductive terminal fall, as well as the straight line on which the fifth conductive terminal and the sixth conductive terminal fall.

More particularly, wherein the insulated main body is provided with two notches, and the two notches are relatively configured on the two opposite sides of the insulated main body; wherein the wire set includes: the first wire that runs through one notch and the fourth wire that runs through the other notch, and the first wire and the fourth wire are formed with a cut portion at the position of the notch.

More particularly, wherein the conductive terminals include: first conductive terminal, second conductive terminal, third conductive terminal, fourth conductive terminal, fifth conductive terminal, sixth conductive terminal, seventh conductive terminal, eighth conductive terminal; the wire set includes: first wire, second wire, third wire, and fourth wire, the first wire runs through one notch and is connected to the first conductive terminal and the second conductive terminal on the two sides, and is formed with a cut portion at the position of the notch; the second wire is sequentially connected to the third conductive terminals and the fourth conductive terminals of all the LED components, the third wire is sequentially connected to the fifth conductive terminals and the sixth conductive terminals of all the LED components, the fourth wire runs through the other notch and is connected to the seventh conductive terminal and eighth conductive terminal on the two sides, and is formed with a cut portion at the position of the notch; the straight line on which the first conductive terminal and the second conductive terminal fall, the straight line on which the third conductive terminal and the fourth conductive terminal fall, the straight line on which the fifth conductive terminal and the sixth conductive terminal fall, and the straight line on which the seventh conductive terminal and the eighth conductive terminal fall are parallel to each other.

An LED strip manufacturing method thereof, the method uses a wire set to connect a plurality of LED components to form a light strip, and is characterized in that: the LED component is formed with a recessed notch, firstly the LED component is fixed onto the wire set through soldering, the wire set at least has one first wire that runs through the notch, then the first wire is cut by a cutter at the position of the notch using the space of the notch, whereas other wires that do not run through the notch are not cut.

More particularly, the wire set includes a power wire to supply power to the LED component and a data wire to transmit control signals, wherein the first wire is the data wire.

More particularly, during manufacturing, after each LED component is soldered onto the wire set, a cutter is used to cut the first wire at the position of the notch, or, after all LED components are soldered onto the wire set, a cutter is used to cut the first wire at the position of the notch of each LED component.

LED components used in the LED strip in claim 1, including an insulated main body, conductive terminals fixed on the insulated main body and connected to the wires of the LED strip, and lighting LED chips and control units configured on the insulated main body, characterized in that: the insulated main body is provided with a recessed notch, and conductive terminals are provided on the two sides of the notch.

More particularly, wherein a concave holding chamber is formed on the surface of the insulated main body, inside the holding chamber, conductive plates corresponding to the conductive terminals are configured; the notch avoids the position of the holding chamber, and runs through the top and bottom surfaces of the insulated main body.

More particularly, wherein the conductive terminals include: first conductive terminal and second conductive terminal located on the two sides of the notch, the straight line on which the first conductive terminal and second conductive terminal fall runs through the notch.

More particularly, wherein the insulated main body is provided with two notches, and the two notches are relatively configured on the opposite sides of the insulated main body.

Based on the technical solution, the present invention has the following advantages comparing to the prior art:

In the present invention, the insulated main body of the LED component is performed with a recessed notch. The notch provides a cutting position for subsequent cutting operations for the corresponding connecting wires. In this way, when producing LED strips with series signal connection, the LED components and the corresponding continuous wires can be soldered directly through SMT technique. Then, through a cutter and the preformed notch, the wires running through the notch are cut. Thus, the SMT soldering operation for the light strip can be completed quickly. The cutting operation can also be completed quickly manually or automatically to enhance production efficiency and product quality.

DETAILED DESCRIPTION OF THE INVENTION

The technical problem to be solved by the present invention is to overcome the shortcomings of the prior art and provide an LED light string. In the LED light string, an inwardly recessed notch is reserved on the insulating body of each LED device, and the notch does not affect. The circuit connection of the LED chip and the control unit only provides the corresponding cutting position for the subsequent cutting of the corresponding connecting wire.

Figure 1:
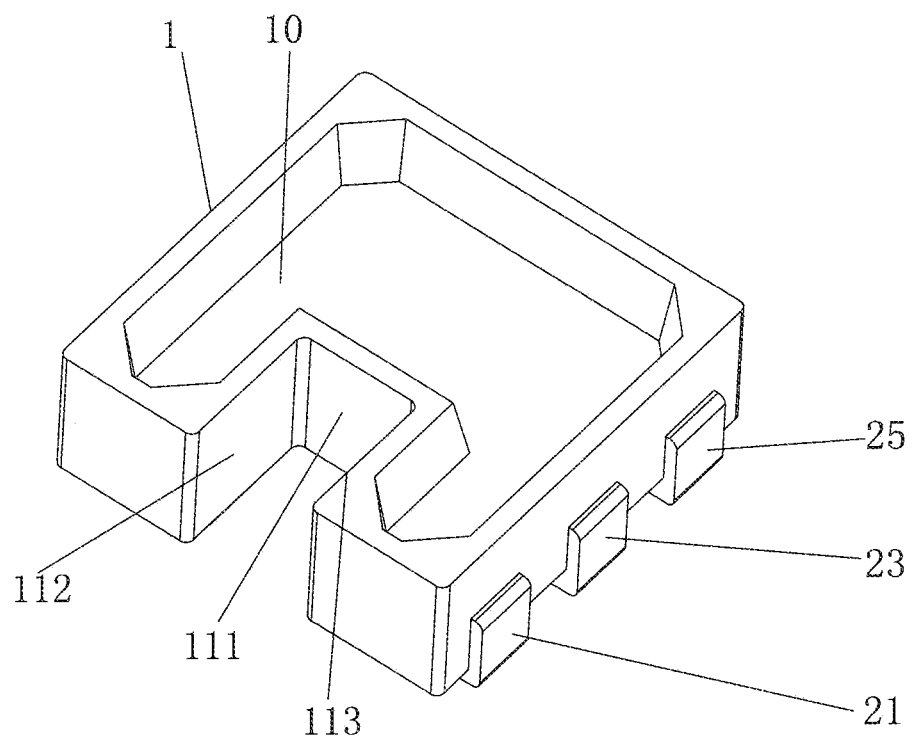
FIG. 1 is a perspective view of Embodiment 1 of the LED component according to the invention.
Figure 2:
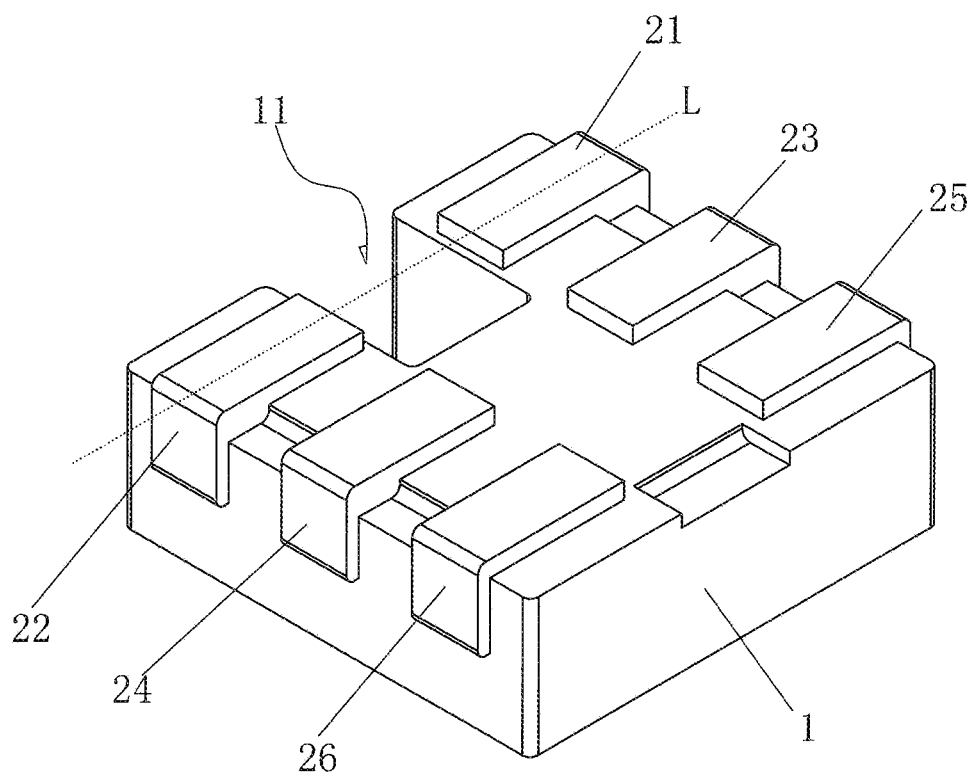
FIG. 2 is a perspective view of Embodiment 1 of the LED component from another angle.
Figure 3:
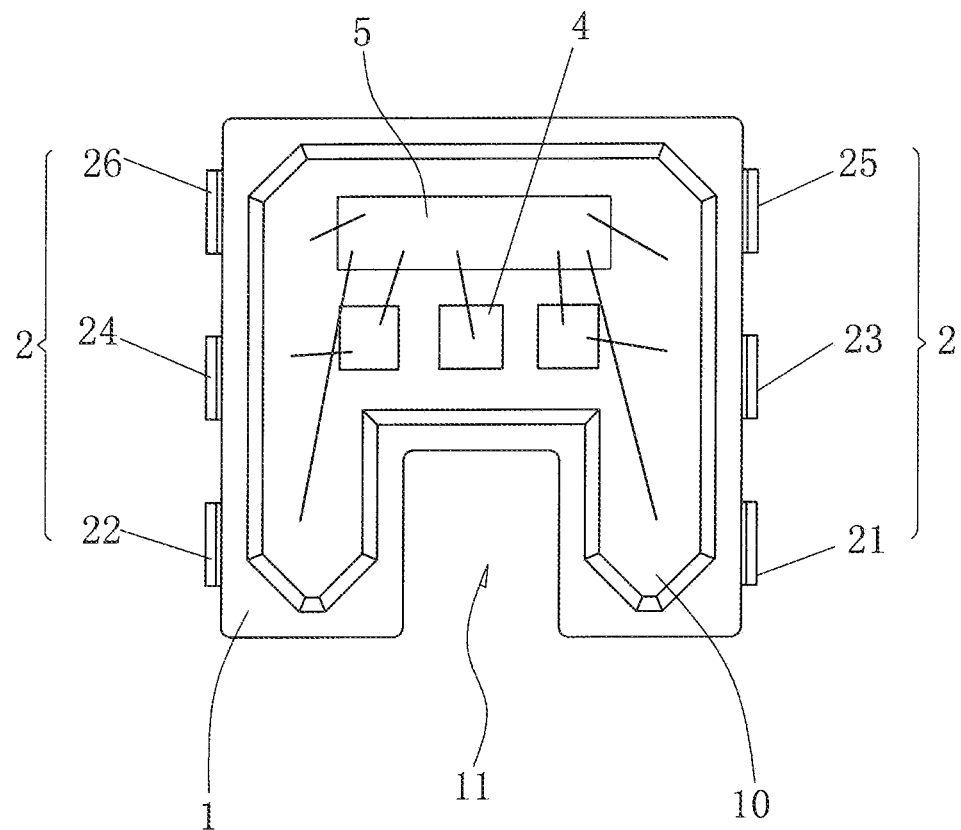
FIG. 3 is a schematic view of Embodiment 1 of the LED component according to the invention.

To facilitate descriptions of the invention, the LED component of the invention is firstly described. Depicted in FIG. 1 through FIG. 3 is Embodiment 1 of the LED component according to the invention, which comprises: an insulated main body 1, conductive terminals 2 fixed on the insulated main body 1, and an LED chip 4 and a control unit 5 for lighting.

The insulated main body 1 is made of plastic or ceramic insulating materials. The surface of the insulated main body 1 is recessed to form a holding chamber 10. The holding chamber is used for configuration of components like the LED chip 4 and the control chip as the control unit 5. Finally, a material such as plastic resin is used to package the whole holding chamber 10. The insulated main body 1 is provided with a recessed notch 11. The notch 11 avoids the position of the holding chamber 10, and runs through the top and bottom surfaces of the insulated main body 1. Referring to FIG. 1, the notch 11 is roughly in a "C" shape, including: a bottom surface 111 opposite to the opening, a left side surface 112 and a right side surface 113 located on the left and right sides of the bottom surface 111. That is to say, the notch 11 will not interfere with the holding chamber 10, the holding chamber 10 is still a recessed area with sealed periphery. The configuration of the notch 11 will not affect the subsequent LED packaging.

The conductive terminal 2 is made of a metallic material. The conductive terminal 2 can be fixed together with the insulated main body 1 through integral forming. One end of each conductive terminal 2 is exposed on the bottom surface of the holding chamber 10, to act as the contact terminal; the other end of the conductive terminal 2 is extended to the outer surface of the insulated main body 1, to form a soldering portion. The LED chip 4 and the control unit 5 are soldered through a wire to the soldering portion to form a lighting control circuit.

Normally, the conductive terminal 2 disclosed in the invention at least has four conductive terminals, among which, two conductive terminals are used as positive and negative electrodes for the power source, the other two are used as signal electrodes. Embodiment 1 is configured with six conductive terminals, respectively being: first conductive terminal 21, second conductive terminal 22, third conductive terminal 23, fourth conductive terminal 24, fifth conductive terminal 25, and sixth conductive terminal 26. Among the six conductive terminals, the first conductive terminal 21 and the second conductive terminal 22 are used as signal electrodes, the third conductive terminal 23, the fourth conductive terminal 24, the fifth conductive terminal 25 and the sixth conductive terminal 26 are respectively used as positive and negative electrodes for the power source. Referring to FIG. 2, the first conductive terminal 21 and the second conductive terminal 22 are located on the two sides of the notch 11, i.e., the straight line L on which the first conductive terminal 21 and the second conductive terminal 22 fall goes through the notch 11, so as to facilitate the subsequent cutting. Among the six conductive terminals, the straight line L on which the first conductive terminal 21 and second conductive terminal 22 fall is parallel to the straight line on which the third conductive terminal 23 and fourth conductive terminal 24 fall, and the straight line on which the fifth conductive terminal 25 and the sixth conductive terminal 26 fall to facilitate the subsequent soldering operation: three wires respectively run through the first conductive terminal 21 and the second conductive terminal 22, the third conductive terminal 23 and the fourth conductive terminal 24, the fifth conductive terminal 25 and the sixth conductive terminal 26. After soldering, the corresponding wire is cut at the position of the notch 11.

Referring to FIG. 3, during production, for example, components like an RGB 3-color LED chip 4 and a control unit 5 are fixed inside the holding chamber 10, and are connected to each lead terminal through wires. Finally, a transparent plastic material for packaging is filled into the holding chamber to complete the packaging operation to form the LED component. A plurality of LED components and wires are connected through SMT soldering. Finally, the wire corresponding to the LED component is cut at the position of the notch 11. Of course, cutting can also be conducted before the overall packaging.

Figure 4:
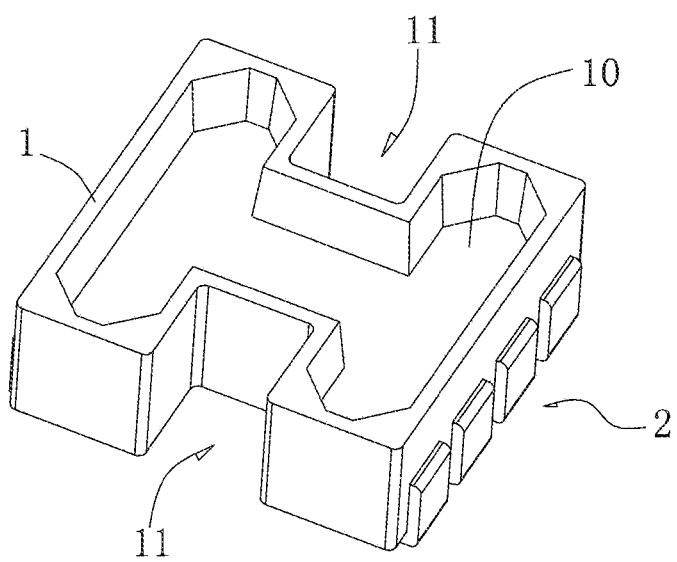
FIG. 4 is a perspective view of Embodiment 2 of the LED component according to the invention.
Figure 5:
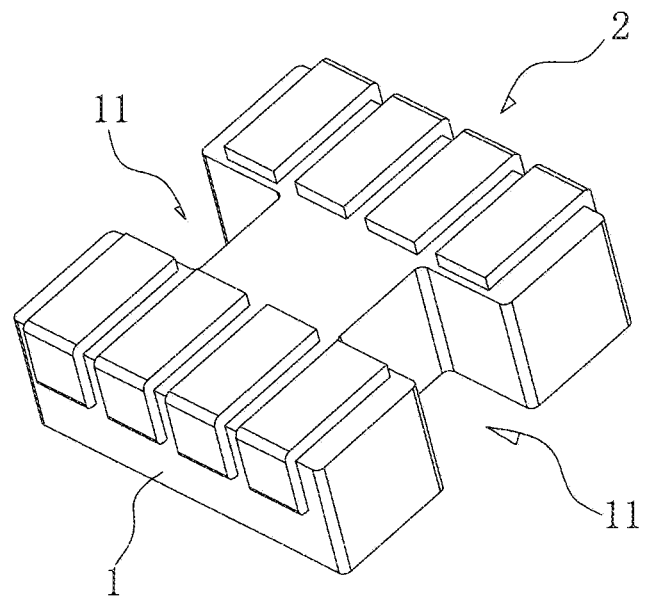
FIG. 5 is a perspective view of Embodiment 2 of the LED component from another angle.

Depicted in FIG. 4 and FIG. 5 is Embodiment 2 of the LED component according to the invention. It differs from Embodiment 1 in that, the conductive terminal 2 has eight conductive terminals. The insulated main body 1 is provided with two notches 11 running through the insulated main body 1. The two notches 11 are relatively provided on the opposite sides of the insulated main body 1. This is designed to meet LED component products with more complicated electric circuits.

In the present invention, the shape and size of the notch 11 can be designed as needed and is not limited to any particular design. On the condition that it does not affect proper installation of components like LED chip in the holding chamber, it can be in any design as long as it allows a sufficient cutting space for subsequent cutting using a cutter or scissors.

Figure 6:
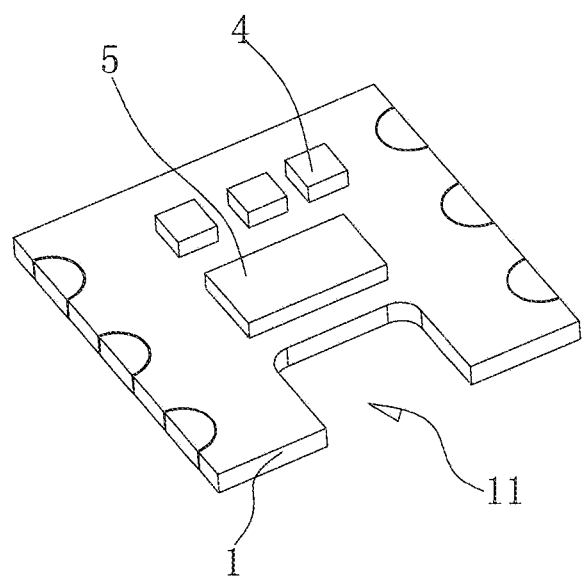
FIG. 6 is a perspective view of Embodiment 3 of the LED component according to the invention.
Figure 7:
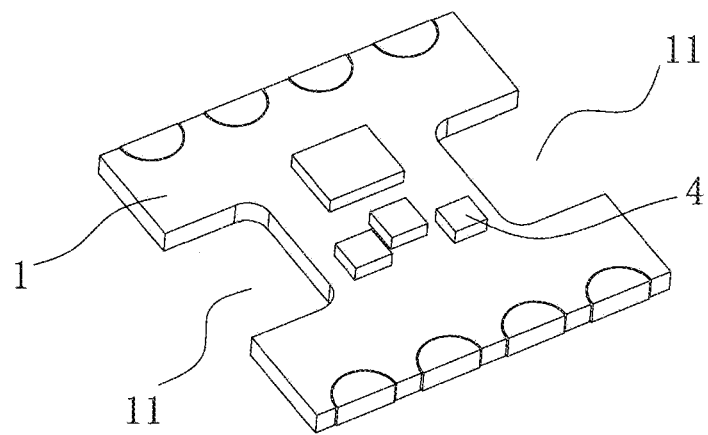
FIG. 7 is a perspective view of Embodiment 4 of the LED component according to the invention.

Depicted in FIG. 6 and FIG. 7 are Embodiment 3 and Embodiment 4 of the LED component according to the present invention. These two embodiments both adopt LED components with direct packaging, the surface of the insulated main body 1 are not provided with a holding chamber. Components like the LED chip 4 and the control unit 5 are directly configured on the surface of the insulated main body 1. Then, a material like plastic resin is used to pack the components like the LED chip 4 and the control unit 5.

Figure 8:
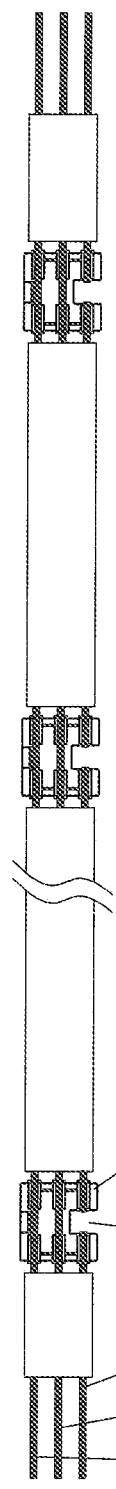
FIG. 8 is a main view of Embodiment 1 of the LED component according to the invention.
Figure 9:
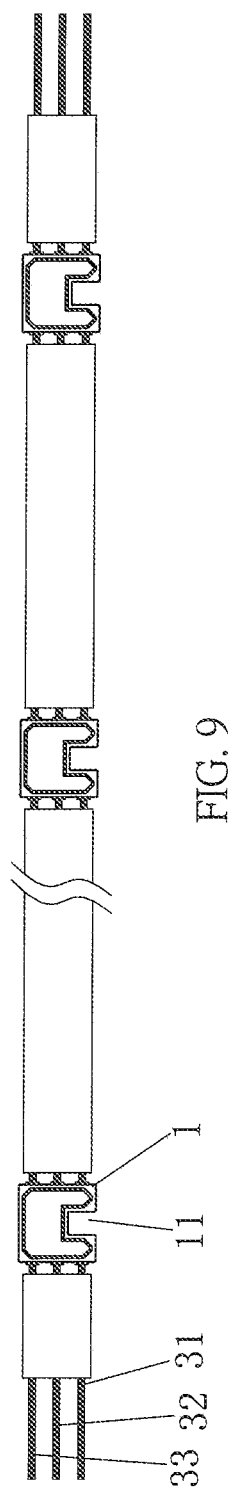
FIG. 9 is a rear view of Embodiment 1 of the LED component according to the invention.

Depicted in FIG. 8 and FIG. 9 is Embodiment 1 of the LED component according to the invention, comprising: a plurality of aforethe LED components, and a wire set to connect the plurality of LED components to form a light strip.

Figure 10:
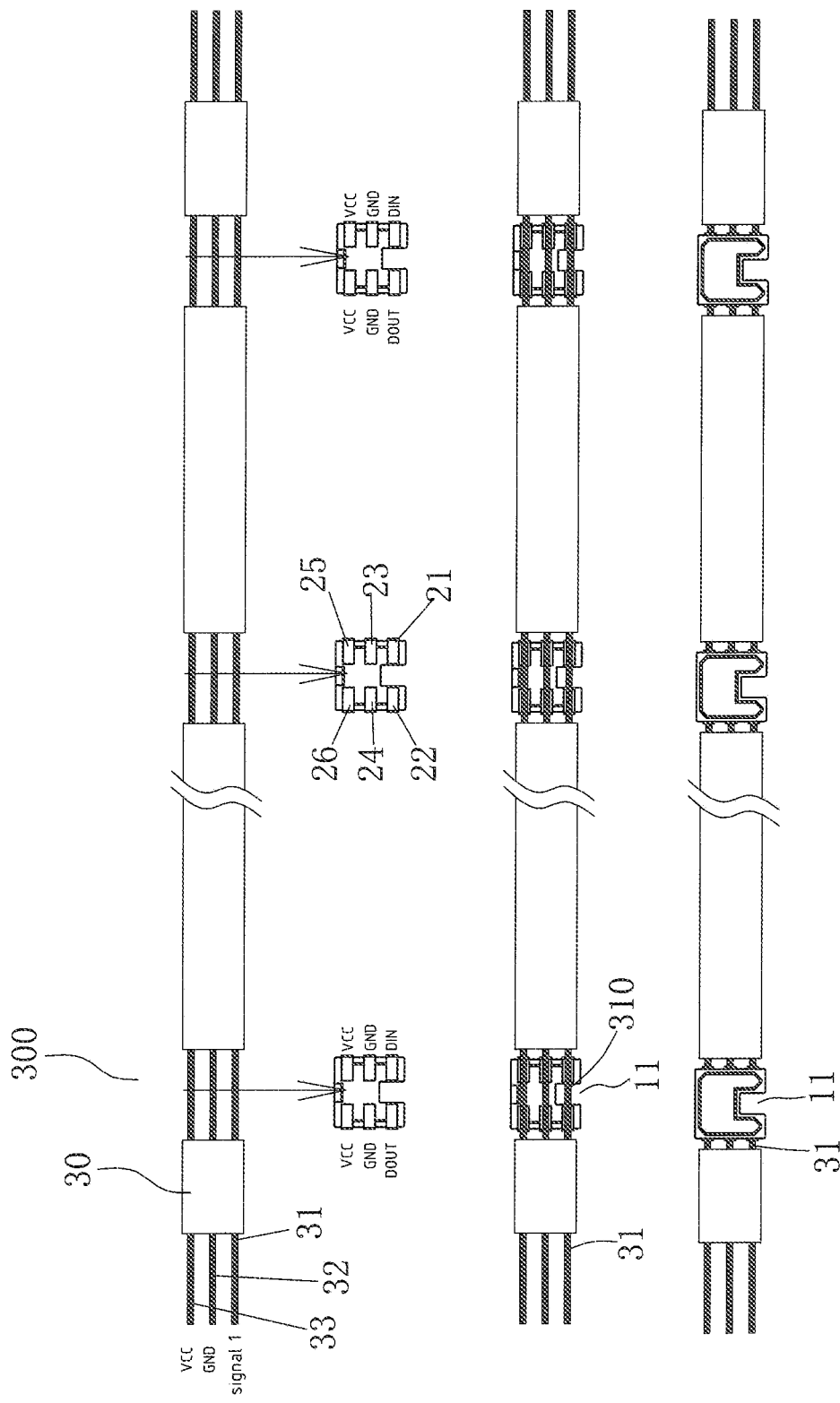
FIG. 10 is a production flow chart of Embodiment 1 of the LED component according to the invention.

The LED strip in this Embodiment 1 uses the above-mentioned Embodiment 1 of the LED component, i.e., the LED component has six conductive terminals. Referring to FIG. 10, the conductive terminals 2 include: first conductive terminal 21, second conductive terminal 22, third conductive terminal 23, fourth conductive terminal 24, fifth conductive terminal 25 and sixth conductive terminal 26. The wire set includes: first wire 31, second wire 32 and third wire 33. The first wire 31 runs through the notch 11, and is electrically connected to the first conductive terminal 21 and the second conductive terminal 22. Meanwhile, the first wire 31 is formed with a cut portion 310 at the position of the notch 11. The second wire 32 sequentially connects the third conductive terminals 23 and the fourth conductive terminals 24 of all the LED components. The third wire 33 sequentially connects the fifth conductive terminals 25 and the sixth conductive terminals 26 of all the LED components; moreover, the straight line on which the first conductive terminals 21 and the second conductive terminals 22 fall, the straight line on which the third conductive terminals 23 and the fourth conductive terminals 24 fall, and the straight line on which the fifth conductive terminals 25 and the sixth conductive terminals 26 fall are parallel to each other, i.e., the first, second, and third wires are soldered on the conductive terminals in parallel. Such a design facilitates SMT soldering.

In the present invention, the LED strip is produced by using the wire set to connect a plurality of LED components to form a light strip. As each LED component is formed with a recessed notch, when the LED component is firstly fixed on the wire set through soldering, it is configured that there is at least one first wire among the wire set running through the notch. Then, through a cutter and the preformed notch, the first wire running through the notch is cut. Other wires that do not run through the notch are not cut. In production, the first wire is cut by a cutter at the position of the notch after each LED component is soldered onto the wire set, or, after all the LED components are soldered onto the wire set, the first wire of each LED component is then respectively cut by a cutter at the position of the notch.

FIG. 10 shows the production flow chart of Embodiment 1 of the LED component. The three wires in the wire set, i.e., the first, second and third wires can directly use ribbon cables 30 with plastic casing. Then, the casing of the ribbon cable 30 is removed at the installation position 300 of the LED component to expose the three wires inside. The connection can be realized directly through SMT soldering. Soldering tin is applied at each installation position 300 of the three wires. Then, an LED component is attached to each installation position 300. After heating, the LED components and the ribbon cables 30 can be soldered together. During soldering, each wire shall match its corresponding conductive terminal. As mentioned above, the present invention can realize transmission of serial signals, therefore, the wire set includes power wires to supply power to the LED component and data wires to transmit the control signals, wherein, the first wire is a data wire, the second wire and third wire are power wires. Correspondingly, the first conductive terminal 21 and the second conductive terminal 22 are used as the electrodes for signal transmission (DIN terminal for data input and DOUT terminal for data output), the third conductive terminal 23, the fourth conductive terminal 24, the fifth conductive terminal 25, and the sixth conductive terminal 26 are used as the electrodes for power connection (VCC terminal and GND terminal for power connection).

Figure 11:
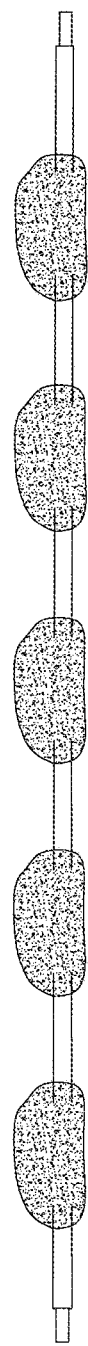
FIG. 11 is a schematic view of Embodiment 1 of the LED component after packaging.

After completion of the soldering operation, the first wire 31 is cut at the position of the notch 11 through automatic cutters or manually. The first wire 31 is formed with a cut portion 310 at the position of the notch 11. In this way, the LED strip is formed. Finally, using SMT packaging techniques, the positions on the light strip where LED components are installed are packaged using materials like resin, as illustrated in FIG. 11.

Figure 12:
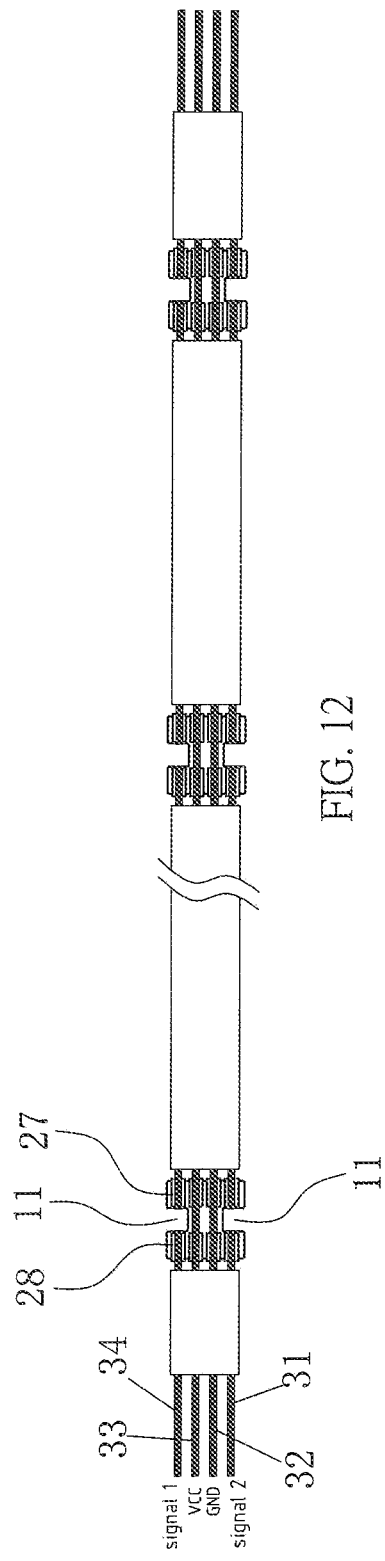
FIG. 12 is a rear view of the second embodiment of the LED light string in the present invention.

The above Embodiment 1 only needs one serial signal wire (i.e., first wire 31) for signal control. The signal wire is connected to the control unit of the LED component through the first conductive terminal 21 and the second conductive terminal 22. External control signals are transmitted serially through the signal wire. However, for some more complicated LED strip products, two or more serial signal wires are required. Referring to FIG. 12, the LED component adopted by the LED strip has eight conductive terminals. The insulated main body 1 is provided with two notches 11 running through the insulated main body 1, and the two notches 11 are relatively configured on the opposite sides of the insulated main body 1; the first wire 31 runs through one notch 11, and the fourth wire 34 runs through the other notch 11, and a cut portion is formed at the position of the notches 11.

In the present embodiment, the conductive terminals 2 include: first conductive terminal 21, second conductive terminal 22, third conductive terminal 23, fourth conductive terminal 24, fifth conductive terminal 25, sixth conductive terminal 26, seventh conductive terminal 27, and eighth conductive terminal 28; the wire set includes: first wire 31, second wire 32, third wire 33, and fourth wire 34. It differs from the preceding embodiments in that: the fourth wire 34 runs through another notch 11 and is connected to the seventh conductive terminal 27 and the eighth conductive terminal 28 located on the two sides, and is formed with a cut portion at the position of the notch 11. Other aspects are same as the preceding embodiments and are not detailed here.

I claim:

1. An LED strip manufacturing method, the method consisting of a wire set to connect a plurality of LED components to form a light strip, wherein the LED component is formed with a recessed notch, firstly the LED component is fixed onto the wire set through soldering, the wire set at least has one first wire that runs across the notch, then the first wire is cut by a cutter at the position of the notch using the space of the notch, whereas other wires that do not run through the notch are not cut.

2. The LED strip manufacturing method defined in claim 1, wherein the wire set includes a power wire to supply power to the LED component and a data wire to transmit control signals, wherein the first wire is the data wire.

3. The LED strip manufacturing method defined in claim 1, during manufacturing, after each LED component is soldered onto the wire set, a cutter is used to cut the first wire at the position of the notch, or, after all LED components are soldered onto the wire set, a cutter is used to cut the first wire at the position of the notch of each LED component.

* * * * *